(12) United States Patent
Li et al.

(10) Patent No.: US 11,145,602 B2
(45) Date of Patent: Oct. 12, 2021

(54) ALIGNMENT MARK STRUCTURE AND METHOD OF FABRICATING THE SAME

(71) Applicant: UNITED MICROELECTRONICS CORP., Hsin-Chu (TW)

(72) Inventors: Kun-Ju Li, Tainan (TW); Jhih-Yuan Chen, Kaohsiung (TW); Hsin-Jung Liu, Pingtung County (TW); Chau-Chung Hou, Tainan (TW); Yu-Lung Shih, Tainan (TW); Ang Chan, Taipei (TW); Fu-Chun Hsiao, Changhua County (TW); Ji-Min Lin, Taichung (TW); Chun-Han Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 74 days.

(21) Appl. No.: 16/786,919

(22) Filed: Feb. 10, 2020

(65) Prior Publication Data
US 2021/0249357 A1 Aug. 12, 2021

(51) Int. Cl.
*H01L 23/544* (2006.01)
*H01L 27/22* (2006.01)
*H01L 43/12* (2006.01)
*H01L 43/02* (2006.01)
(Continued)

(52) U.S. Cl.
CPC ......... *H01L 23/544* (2013.01); *H01L 27/222* (2013.01); *H01L 43/02* (2013.01); *H01L 43/08* (2013.01); *H01L 43/10* (2013.01); *H01L 43/12* (2013.01); *H01L 2223/54426* (2013.01)

(58) Field of Classification Search
CPC ......... H01L 23/544; H01L 2223/54426; H01L 43/08; H01L 43/10; H01L 27/222; H01L 43/02; G03F 9/7076; G03F 9/708; G03F 9/7084
See application file for complete search history.

(56) References Cited

U.S. PATENT DOCUMENTS 6,949,839 B2 * 9/2005 Farrar .................. G03F 9/7076
174/262
7,180,199 B2 * 2/2007 Machida ............... H01L 23/544
257/620

(Continued)

*Primary Examiner* — Bilkis Jahan
*Assistant Examiner* — Victor V Barzykin
(74) *Attorney, Agent, or Firm* — Winston Hsu

(57) ABSTRACT

An alignment mark structure includes a dielectric layer. A trench is embedded in the dielectric layer. An alignment mark fills up the trench, wherein the alignment mark includes a metal layer covering the trench. A first material layer covers and contacts the metal layer. A second material layer covers and contacts the first material layer. A third material layer covers and contacts the second material layer. The first material layer, the second material layer, and the third material layer independently includes silicon nitride, silicon oxide, tantalum-containing material, aluminum-containing material, titanium-containing material, or a low-k dielectric having a dielectric constant smaller than 2.7, and a reflectance of the first material layer is larger than a reflectance of the second material layer, the reflectance of the second material layer is larger than a reflectance of the third material layer.

13 Claims, 5 Drawing Sheets

(51) Int. Cl.
*H01L 43/08* (2006.01)
*H01L 43/10* (2006.01)

(56) References Cited

U.S. PATENT DOCUMENTS

| | | | | |
|---|---|---|---|---|
| 7,241,668 | B2* | 7/2007 | Gaidis | B82Y 10/00 |
| | | | | 257/E21.304 |
| 8,592,884 | B2* | 11/2013 | Watanabe | H01L 28/60 |
| | | | | 257/303 |
| 2002/0098707 | A1* | 7/2002 | Ning | H01L 23/544 |
| | | | | 438/712 |
| 2002/0185671 | A1* | 12/2002 | Kim | H01L 21/7687 |
| | | | | 257/301 |
| 2003/0122061 | A1* | 7/2003 | Kawano | H01S 5/02326 |
| | | | | 250/214 R |
| 2004/0102014 | A1* | 5/2004 | Ning | H01L 28/40 |
| | | | | 438/393 |
| 2006/0024923 | A1* | 2/2006 | Sarma | H01L 23/544 |
| | | | | 438/462 |
| 2020/0051922 | A1* | 2/2020 | Wang | H01L 27/222 |
| 2020/0073228 | A1* | 3/2020 | Tanaka | G03F 1/80 |
| 2020/0185597 | A1* | 6/2020 | Li | H01L 23/544 |

* cited by examiner

ALIGNMENT MARK STRUCTURE AND METHOD OF FABRICATING THE SAME

BACKGROUND OF THE INVENTION

1. Field of the Invention

The present invention relates to an alignment mark structure and a method of fabricating the alignment mark structure, and more particularly to an alignment mark structure which can provide a high optical contrast.

2. Description of the Prior Art

In the production of integrate circuit structures, it has become increasingly important to provide structures having a plurality of components in different material layers due to increasing density of the circuit elements in the structure. Further, as the device and feature sizes becoming smaller, it is important that the lithography mask be aligned precisely with the wafer during the masking step to minimize the misalignment between the layers.

Alignment marks and the process of aligning alignment marks are key aspects of fabricating wafers and integrated circuit (IC) chips in the manufacture of semiconductor components. They are key because the chips themselves and the devices are fabricated by aligning many intricate layers of conductors and insulators on a wafer. Typically, the alignment of one layer with respect to another is accomplished by means of a wafer stepper. The wafer stepper is used to project optically a circuit pattern from a lithography mask onto a layer formed on the wafer. However, before the pattern on the lithography mask is transferred, the wafer must first be positioned or aligned precisely with respect to the lithography mask by using the alignment marks already on the wafer. Once the alignment is accomplished, the remaining steps of projecting the pattern on to the semiconductor may proceed.

Chemical mechanical polishing (CMP) is a commonly used process in the manufacture of semiconductor wafers. CMP is generally accomplished by removal of protruding surface topography and a planarized wafer surface. Thus, if features such as alignment marks on the surface of a wafer are not properly designed and protected from the CMP action, then they can be damaged or destroyed.

Furthermore, many modern electronic devices contain electronic memory configured to store data, such as magnetic random access memory (MRAM) devices. An MRAM cell includes a magnetic tunnel junction (MTJ) having a variable resistance.

The MTJ's of MRAM devices typically comprise a first magnetic layer (pinned layer), a tunnel insulator formed over the first magnetic layer, and a second magnetic layer (free layer) formed over the tunnel insulator. Because the first magnetic layer and second magnetic layer of MTJ's comprise metals, they are opaque, and this makes the stepper can't "see through" the first magnetic layer or the second magnetic layer to locate the alignment marks.

Therefore, an improved method of aligning the opaque materials to the underlying alignment mark, and an alignment mark which can avoid the detrimental effects of CMP are needed.

SUMMARY OF THE INVENTION

In light of the above, the present invention provides a method of fabricating the alignment mark structure and a novel alignment mark structure to solve the above-mentioned problem.

According to a preferred embodiment of the present invention, an alignment mark structure includes a dielectric layer. A trench is embedded in the dielectric layer. An alignment mark fills up the trench, wherein the alignment mark includes a metal layer covering the trench. A first material layer covers and contacts the metal layer. A second material layer covers and contacts the first material layer. A third material layer covers and contacts the second material layer. The first material layer, the second material layer, and the third material layer are independently comprises silicon nitride, silicon oxide, tantalum-containing material, aluminum-containing material, titanium-containing material, or a low-k dielectric having a dielectric constant smaller than 2.7, and a reflectance of the first material layer is larger than a reflectance of the second material layer, the reflectance of the second material layer is larger than a reflectance of the third material layer.

According to anther preferred embodiment of the present invention, a fabricating method of an alignment mark structure includes providing a dielectric layer. Next, a trench is formed to be embedded in the dielectric layer. Later, an alignment mark is formed to fill up the trench, wherein the alignment mark includes a metal layer covering the trench. A first material layer covers and contacts the metal layer. A second material layer covers and contacts the first material layer. A third material layer covers and contacts the second material layer; wherein the first material layer, the second material layer, and the third material layer are independently comprises silicon nitride, silicon oxide, tantalum-containing material, aluminum-containing material, titanium-containing material, or a low-k dielectric having a dielectric constant smaller than 2.7, and a reflectance of the first material layer is larger than a reflectance of the second material layer, the reflectance of the second material layer is larger than a reflectance of the third material layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2-8 are schematic drawings illustrating a fabricating process of an MRAM and an alignment mark structure according to a second preferred embodiment of the present invention, wherein:

FIG. 2 depicts a trench and a connection hole formed in a second dielectric layer;

FIG. 3 depicts a fabricating stage following FIG. 2;

FIG. 4 depicts a fabricating stage following FIG. 3;

FIG. 5 depicts a fabricating stage following FIG. 4;

FIG. 6 depicts a fabricating stage following FIG. 5;

FIG. 7 depicts a fabricating stage following FIG. 6; and

FIG. 8 depicts a fabricating stage following FIG. 7.

DETAILED DESCRIPTION

Figure 1:
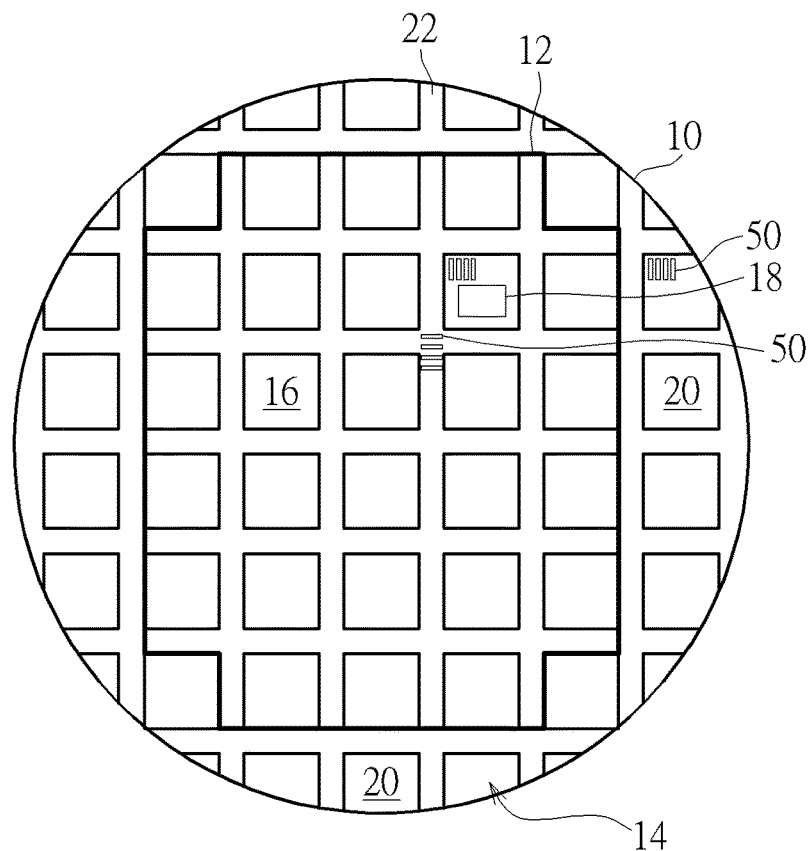
FIG. 1 depicts a wafer with an alignment mark structure thereon according to a first preferred embodiment of the present invention.

FIG. 1 depicts a wafer with alignment mark structures thereon according to a first preferred embodiment of the present invention. As shown in FIG. 1, a wafer 10 is provided. A device region 12 (marked by a bold frame) and an edge region 14 are defined on the wafer 10. In the device region 12, there may be several die regions 16, and each of the die regions 16 has memory cells 18 form thereon. The memory cells 18 may be MRAM arrays or RRAM (resistive random access memory) arrays, etc. In the edge region 14, there may be unused or may have incomplete die regions 20 formed on them. Scribe lines 22 are respectively arranged between the die regions 16/20. An alignment mark structure 50 is disposed on the wafer 10. The alignment mark structure 50 may be disposed in at least one of the die regions 16 within the device region 12. In another exemplary case, the alignment mark structure 50 may be disposed in at least one of the die regions 20 within the edge region 14. In yet another exemplary case, the alignment mark structure 50 may be disposed in at least one of the scribe lines 22. Although the alignment mark structures 50 in FIG. 1 are disposed in the device region 12, the edge region 14 and the scribe line 22 at the same time, based on different requirements, the alignment mark structures 50 can be positioned only in one or two regions selected from the device region 12, the edge region 14 and the scribe line 22. For example, the alignment mark 50 structure is disposed only in the device region 12.

The shape of the alignment mark structure 50 is exemplified as a set of rectangles; however, based on different product requirements, the shape of the alignment mark structure 50 could be other shapes such as a cross or a circle, etc.

FIG. 2-8 are schematic drawings illustrating a fabricating process of an MRAM and an alignment mark structure according to a second preferred embodiment of the present invention.

Figure 2:
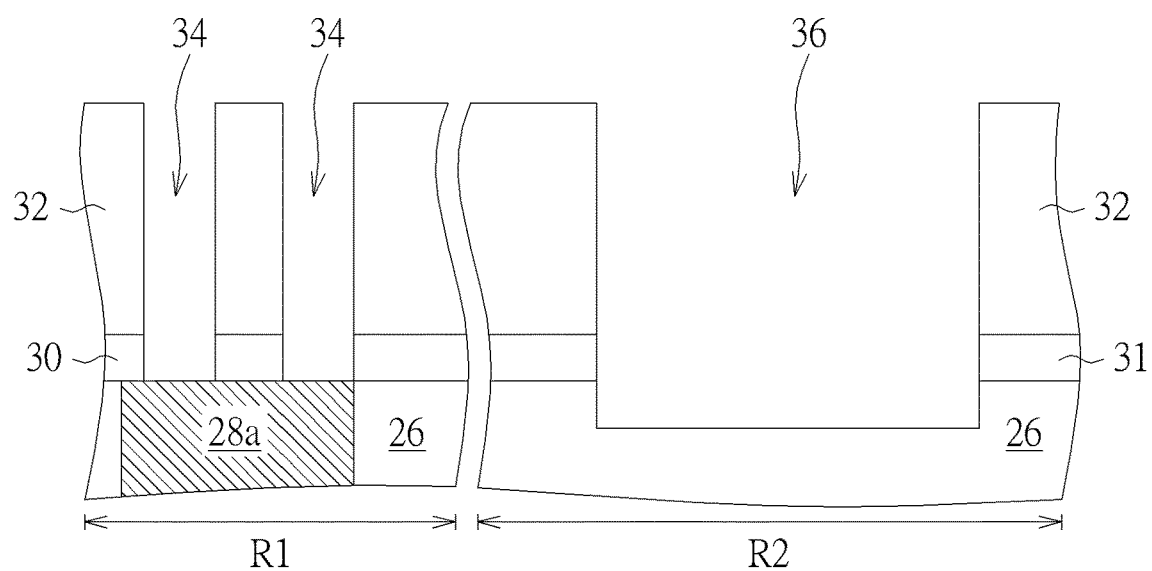
Figure 3:
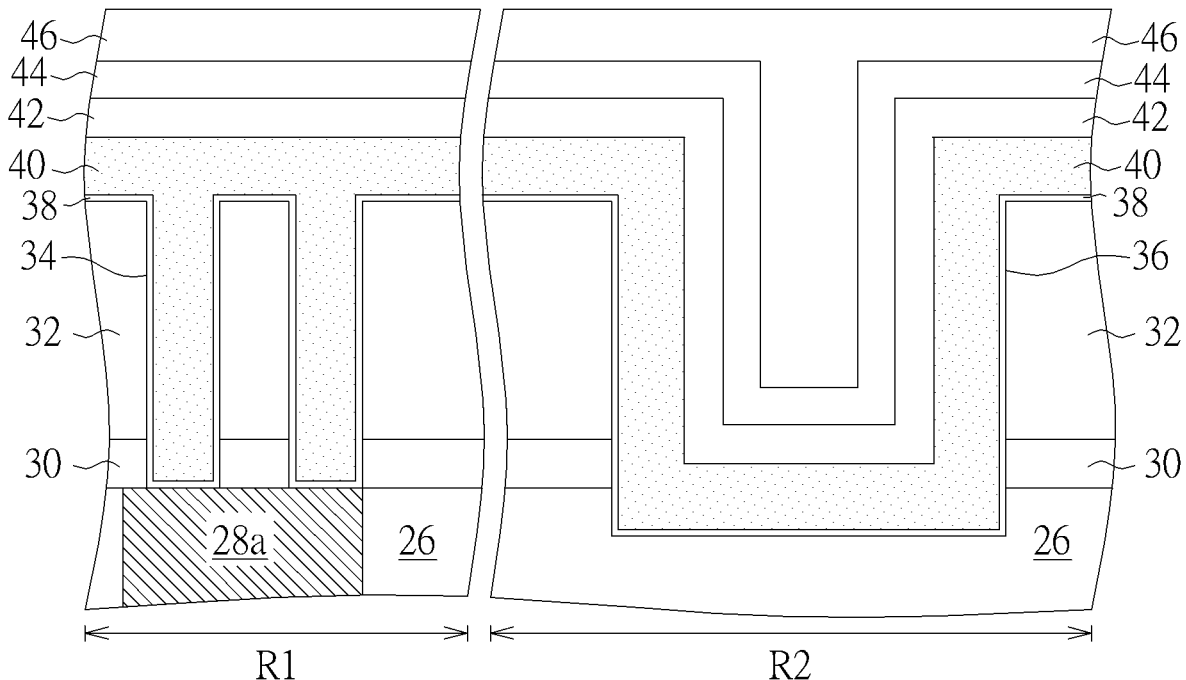

As shown in FIG. 1 and FIG. 2, an insulation layer 26 is provided, and an interconnection structure 28a is formed in the insulation layer 26. The insulation layer 26 may be disposed on the wafer 10. A memory cell region R1 and an alignment mark region R2 are defined on the insulation layer 10. The memory cell region R1 is arranged in each of the die regions 16 and memory cells 18 will be formed in the memory cell region R1. The alignment mark region R2 may be in the device region 12, the edge region 14 or the scribe line 22.

An MRAM subsequently formed on the interconnection structure 28a may be electrically connected to other devices via the interconnection structure 28a and/or other connection structures, but not limited thereto.

A first dielectric layer 30 and a second dielectric layer 32 may be sequentially formed covering the insulation layer 26 and the interconnection structure 28a. The first dielectric layer 30, and the second dielectric layer 32 may respectively tetraethoxysilane (TEOS), boron phospho-silicate glass (BPSG), silicon oxynitride, silicon oxide, silicon nitride or other suitable materials.

A connection hole 34 may be formed penetrating the first dielectric layer 30 and the second dielectric layer 32 on the interconnection structure 28a for exposing a part of the interconnection structure 28a, and a trench 36 may be formed penetrating the first dielectric layer 30 and the second dielectric layer 32 on the alignment mark region R2 for exposing a part of the insulation layer 26. In some embodiments, the connection hole 34 and the trench 36 may be formed concurrently by the same process.

Figure 4:
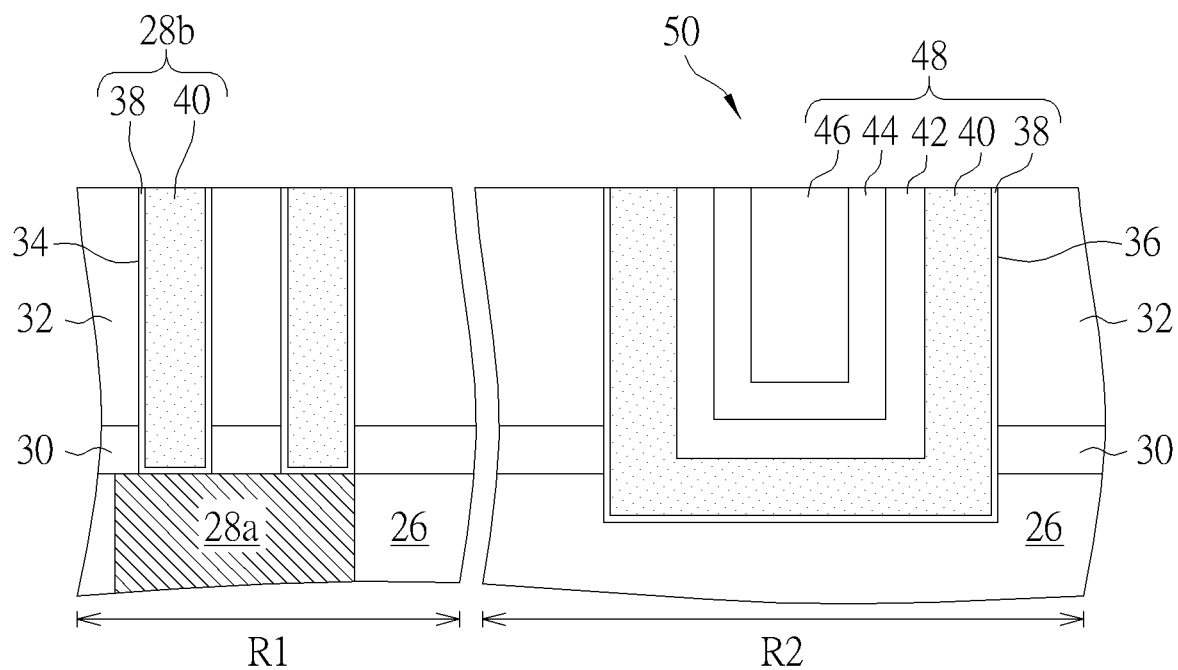

Later, a barrier 38 is formed to conformally cover and contact the connection hole 34, the trench 36, the first dielectric layer 30 and the second dielectric layer 32. Next, a metal layer 40 is formed to conformally cover and contact the barrier 38. Now, the metal layer 40 and the barrier 38 fill up the connection hole 34. The metal layer 40 and the barrier 38 within the connection hole 34 serve as another interconnection structure 28b. Subsequently, a first material layer 42 is formed to conformally cover and contact the metal layer 40 and fills in the trench 36. After that, a second material layer 44 is formed to conformally cover and contact the first material layer 42. Finally, a third material layer 46 is formed to conformally cover and contact the second material layer 44. The depth of the trench 36 is preferably between 300 angstroms and 800 angstroms. As shown in FIG. 4, a chemical mechanical polishing (CMP) is performed to planarize the third material layer 46, the second material layer 44, the first material layer 42, the metal layer 40 and the barrier 38 to entirely remove the third material layer 46, the second material layer 44, the first material layer 44, the metal layer 40 and the barrier 38 outside of the trench 38, and to remove the metal layer 40 and the barrier 38 outside of the connection hole 34.

Moreover, a top surface of each of two ends of the metal layer 40 is aligned with the top surface of the second dielectric layer 32. A top surface of each of two ends of the first material layer 42 is aligned with the top surface of the second dielectric layer 32. A top surface of each of two ends of the second material layer 44 is aligned with the top surface of the second dielectric layer 32. A top surface of the third material layer 46 is aligned with the top surface of the second dielectric layer 32.

After the chemical mechanical polishing, the remaining third material layer 46, the second material layer 44, the first material layer 42, the metal layer 40 and the barrier 38 in the trench 36 form an alignment mark 48. Now, an alignment mark structure 50 of the present invention is completed.

Figure 5:
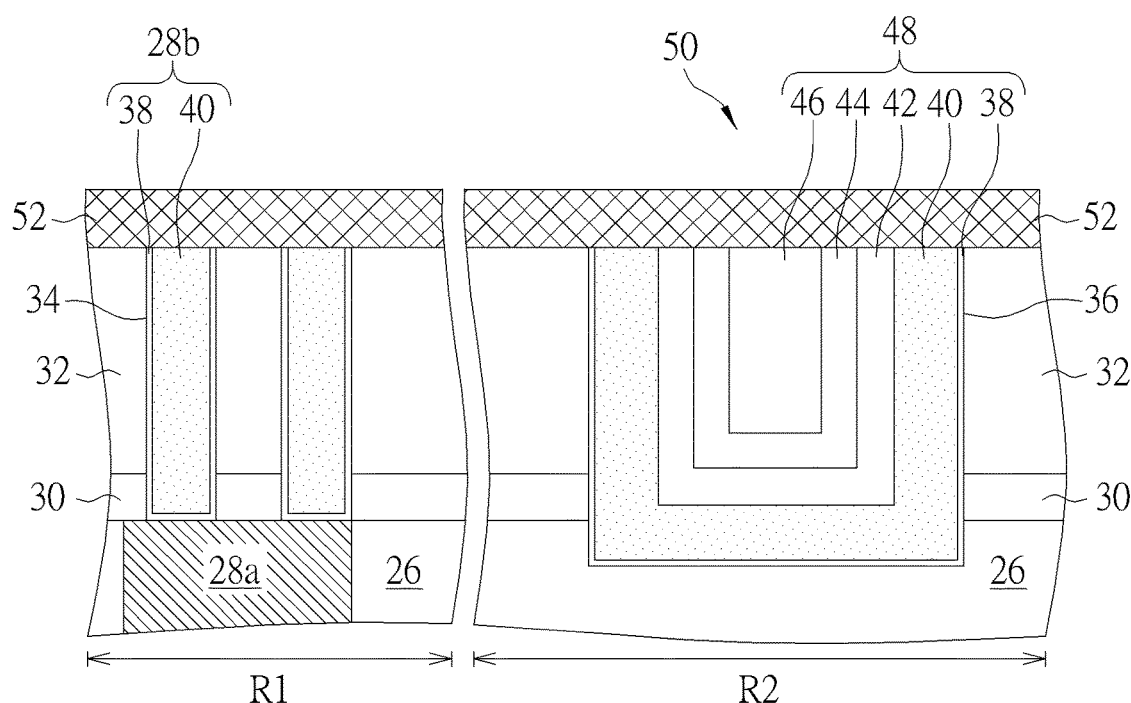
Figure 6:
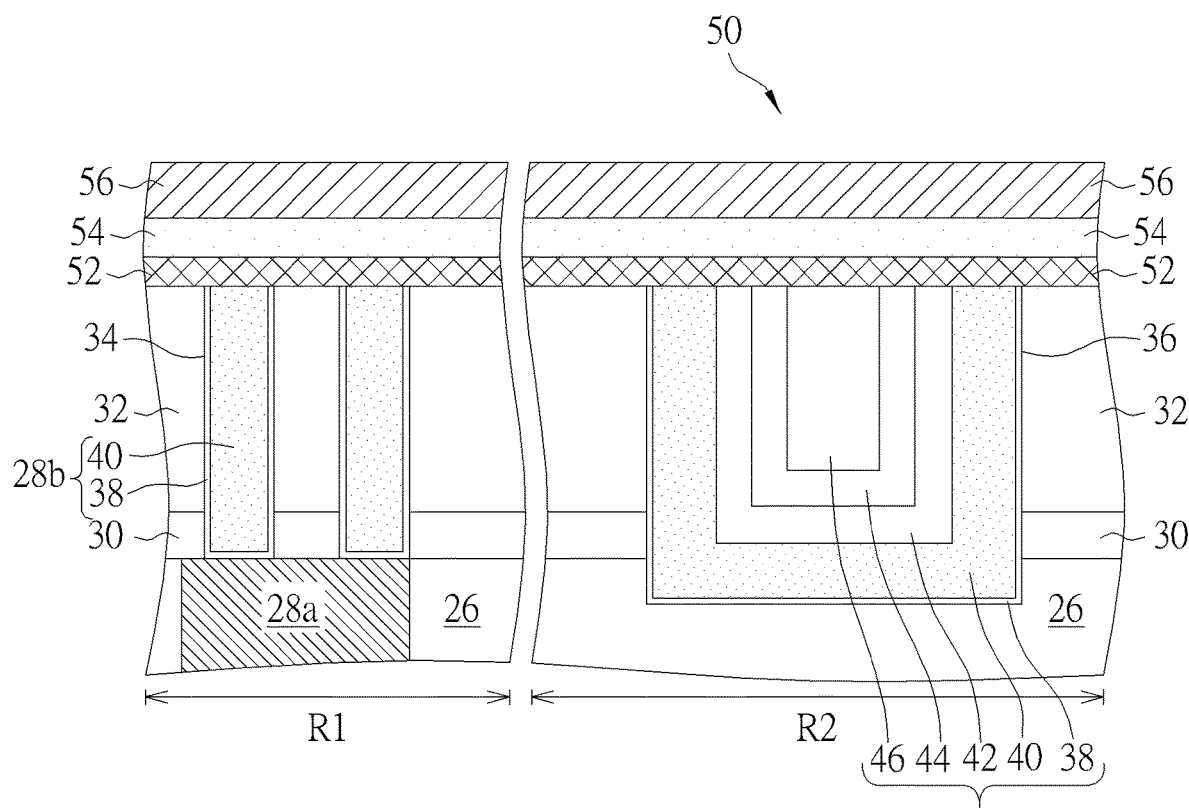

As shown in FIG. 5, a bottom electrode material 52 is formed to cover the alignment mark structure 50, the interconnection structure 28b and the second dielectric layer 32. As shown in FIG. 6, the bottom electrode material 52 is planarized to decrease the thickness of the bottom electrode material 52. Later, a memory material 54 and a hard mask material 56 are formed in sequence to cover the bottom electrode material 52.

Figure 7:
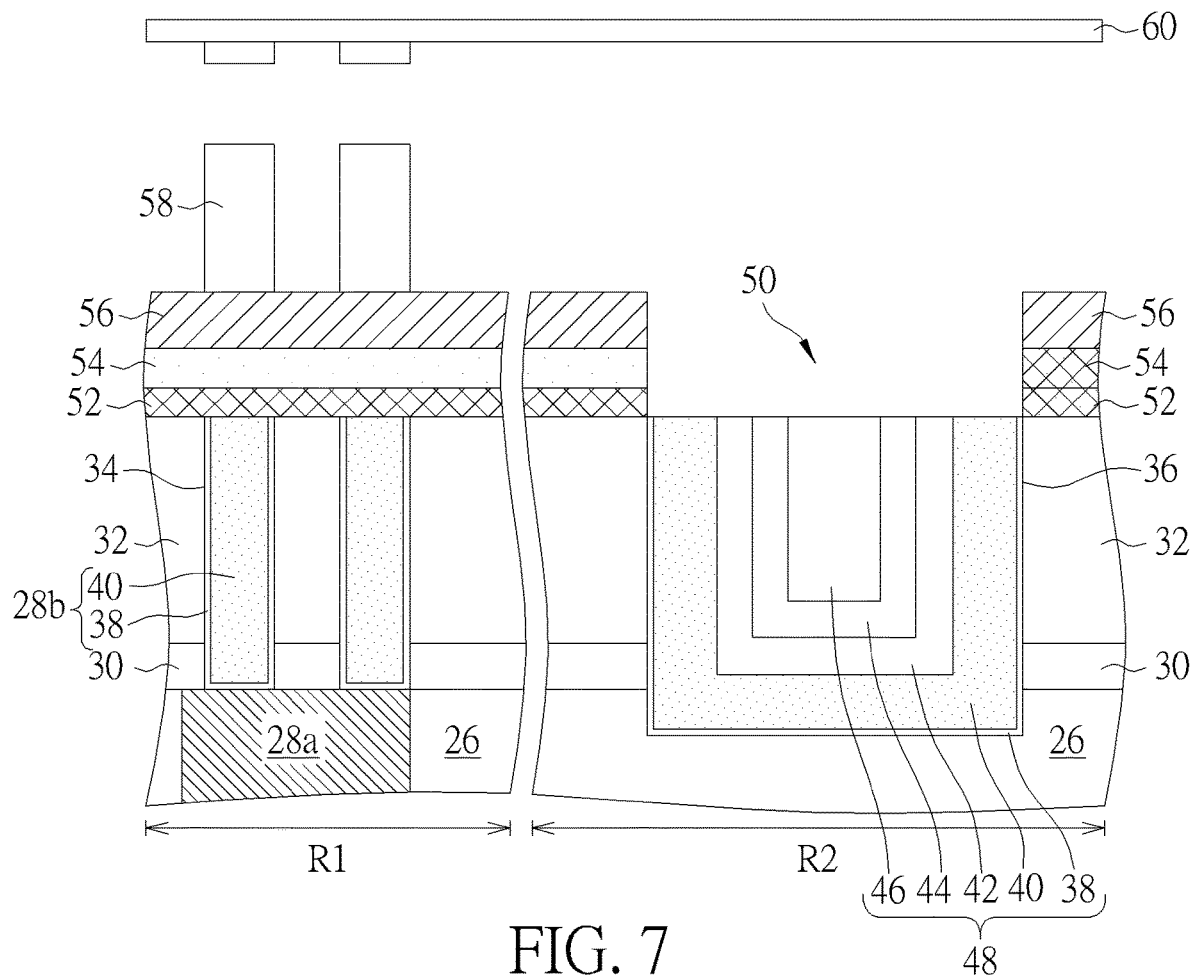

As shown in FIG. 7, part of the hard mask material 56, part of the memory material 54 and part of the bottom electrode material 52 within the alignment mark region R2 are removed so as to expose the alignment mark structure 50. Later, a patterned photoresist layer 58 is formed within the device region R1 to define the position of an MRAM which will be formed later. The alignment mark structure 50 is used to align the lithography mask 60 by a stepper and then the patterned photoresist layer 58 is formed through a lithography process.

Figure 8:
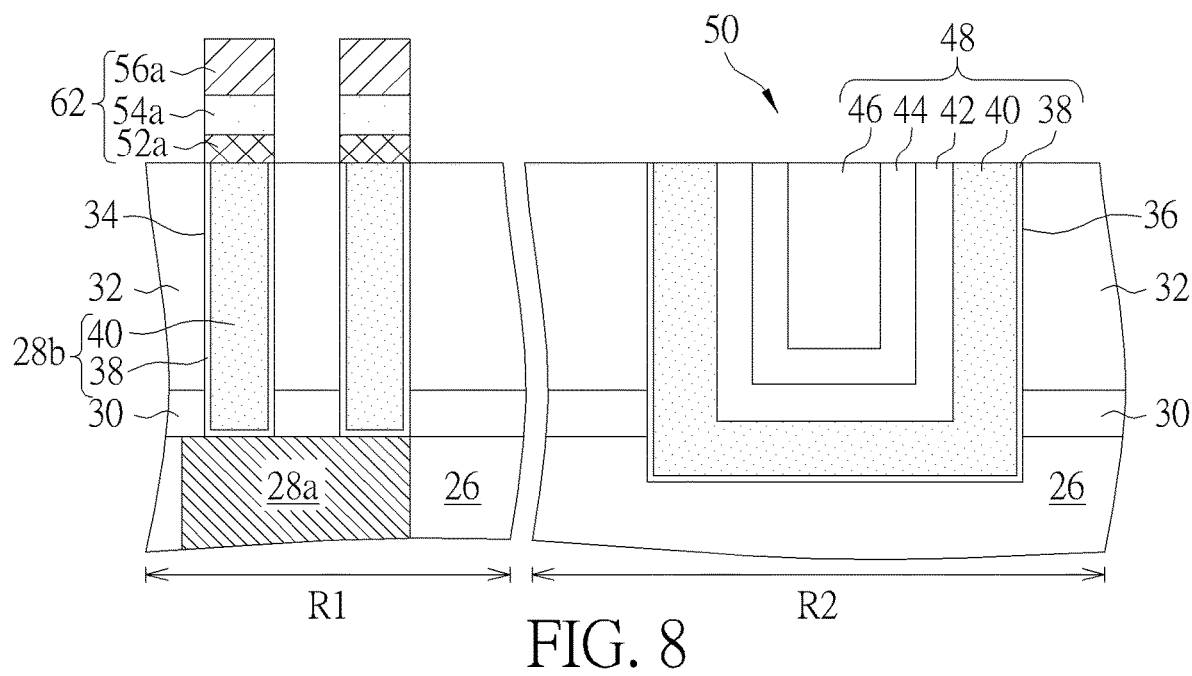

As shown in FIG. 8, the hard mask material 56, the memory material 54 and the bottom electrode material 52 are patterned to become a hard mask 56a, a MTJ film 54a and a bottom electrode 52a. The hard mask 56a, the MTJ film 54a and the bottom electrode 52a form an MRAM 62.

The hard mask 56a may include insulation materials such as silicon nitride, silicon oxynitride, or other suitable insulation materials or conductive materials. In some embodiments, The MTJ film 54a may include a pinned layer, a tunnel insulator, a free layer, a barrier layer, and a conductive layer sequentially stacked with one another. The components of the MTJ film 54a may be modified and/or include other material layers according to other design considerations. The pinned layer in the MTJ film 54a may include antiferromagnetic materials such as iron manganese (FeMn)

or cobalt/platinum (Co/Pt) multilayer, but not limited thereto. The free layer in the MTJ film may include ferromagnetic materials such as cobalt, iron (Fe), cobalt-iron (CoFe), cobalt-iron-boron (CoFeB), or other suitable ferromagnetic materials. The tunnel insulator and the barrier layer in the MTJ film 54a may include insulation materials such as magnesium oxide (MgO), aluminum oxide, or other suitable insulation materials. The material of the conductive layer in the MTJ film 54a may be metallic materials, such as tantalum, tantalum nitride, platinum (Pt), ruthenium (Ru). The material of the conductive layer in the MTJ film 54a may be similar to the material of the bottom electrode 52a, but not limited thereto.

The alignment mark structure 50 of the present invention is suitable for aligning a lithography mask when there is an opaque material layer such as magnetic materials within the MTJ film on the wafer 10.

As shown in FIG. 4, the alignment mark structure 50 includes an insulation layer 26, a first dielectric layer 30, and a second dielectric layer 32. A trench 36 is embedded in the second dielectric layer 32, the first dielectric layer 30 and the insulation layer 26. The depth of the trench 36 is preferably between 300 angstroms and 800 angstroms. An alignment mark 48 fills up the trench 36. A top surface of the alignment mark 48 is aligned with a top surface of the second dielectric layer 32. In details, the alignment mark 48 includes a barrier 38, a metal layer 40, a first material layer 42, a second material layer 44 and the third material layer 46. The barrier 38, the metal layer 40, the first material layer 42, the second material layer 44 and the third material layer 46 are disposed from bottom to top. More specifically speaking, the barrier 38 contacts and conformally covers the trench 36. The metal layer 40 covers the trench 36 and contacts the barrier 38. The first material layer 42 covers and contacts the metal layer 40. The second material layer 44 covers and contacts the first material layer 42. The third material layer 46 covers and contacts the second material layer 44.

The first material layer 42 includes silicon nitride, silicon oxide, tantalum-containing material, aluminum-containing material, titanium-containing material, or a low-k dielectric having a dielectric constant smaller than 2.7. The second material layer 44 includes silicon nitride, silicon oxide, tantalum-containing material, aluminum-containing material, titanium-containing material, or a low-k dielectric having a dielectric constant smaller than 2.7. The third material layer 46 includes silicon nitride, silicon oxide, tantalum-containing material, aluminum-containing material, titanium-containing material, or a low-k dielectric having a dielectric constant smaller than 2.7. The first material layer 42, the second material layer 44 and the third material layer 46 can be the same or different based on different product requirements.

The tantalum-containing material includes tantalum nitride. The titanium-containing material includes titanium nitride. The aluminum-containing material includes aluminum oxide. The low-k dielectric includes fluorinated silicate glass. The metal layer 40 may be tungsten, copper or aluminum. According to a preferred embodiment of the present invention, a thickness of the third material layer 46 is larger than a thickness of the second material layer 44 and is also larger than a thickness of the first material layer 42. The thickness of the metal layer 40 is preferably larger than the thickness of the third material layer 46. According to a preferred embodiment of the present invention, the total thickness of the barrier 38 is between 50 and 400 angstroms and the barrier 38 can be a multi-layer film stack. The thickness of the metal layer 40 is preferably between 300 and 800 angstroms. The thickness of the first material layer 42 is preferably greater than 80 angstroms. The thickness of the second material layer 44 is preferably greater than 80 angstroms. The thickness of the third material layer 46 is preferably between 20 angstroms and 150 angstroms.

However, based on different product requirements, the thicknesses of the metal layer 40, the first material layer 42, the second material layer 44, the third material layer 46 can be altered. The thickness of the third material layer 46 does not necessarily be the largest among the three material layers. It could be the thickness of the second material layer 44 larger than the thickness of the third material layer 46 for example. Furthermore, in yet another embodiment, the thickness of the metal layer 40 doesn't have to be the largest thickness among the alignment mark 48.

It is noteworthy that a reflectance of the first material layer 42 is larger than a reflectance of the second material layer 44, the reflectance of the second material layer 44 is larger than a reflectance of the third material layer 46. In other words, the respective reflectance of the first material layer 42, the second material layer 44 and the third material layer 46 are arranged from large to small along a direction away from the metal layer 40. For example, the first material layer 42 is nearer to the metal layer 40 and the third material layer 46 is farther from the metal layer 40; therefore, the reflectance of the first material layer 42 is larger than that of the third material layer 46.

According to a preferred embodiment of the present invention, the first material layer 42 is titanium nitride. The second material layer 44 is silicon nitride. The third material layer 46 is silicon oxide. The metal layer 40 is tungsten, and the barrier 38 is a multi-layer film stack including titanium and titanium nitride.

The special arrangement of the reflectance of the first material layer 42, the second material layer 44 and the third material layer 46 makes the alignment mark 48 has a reflectance not greater than 0.3. Therefore, comparing to the second dielectric layer 32, the alignment mark 48 has a much smaller reflectance. In this way, when the stepper projects a laser to detect the alignment mark 48, the contrast between the alignment mark 48 and the second dielectric layer is enhanced because of the small reflectance of the alignment mark 48. Therefore, the stepper can locate the position of the alignment mark 48 more precisely.

Furthermore, although in the second preferred embodiment there are only three material layers in the alignment mark 48, however, there can be more than three material layers in the alignment mark 48. No matter how many the material layers in the alignment mark 48, they have to be arranged with a reflectance from large to small along a direction away from the metal layer 40.

Figure 9:
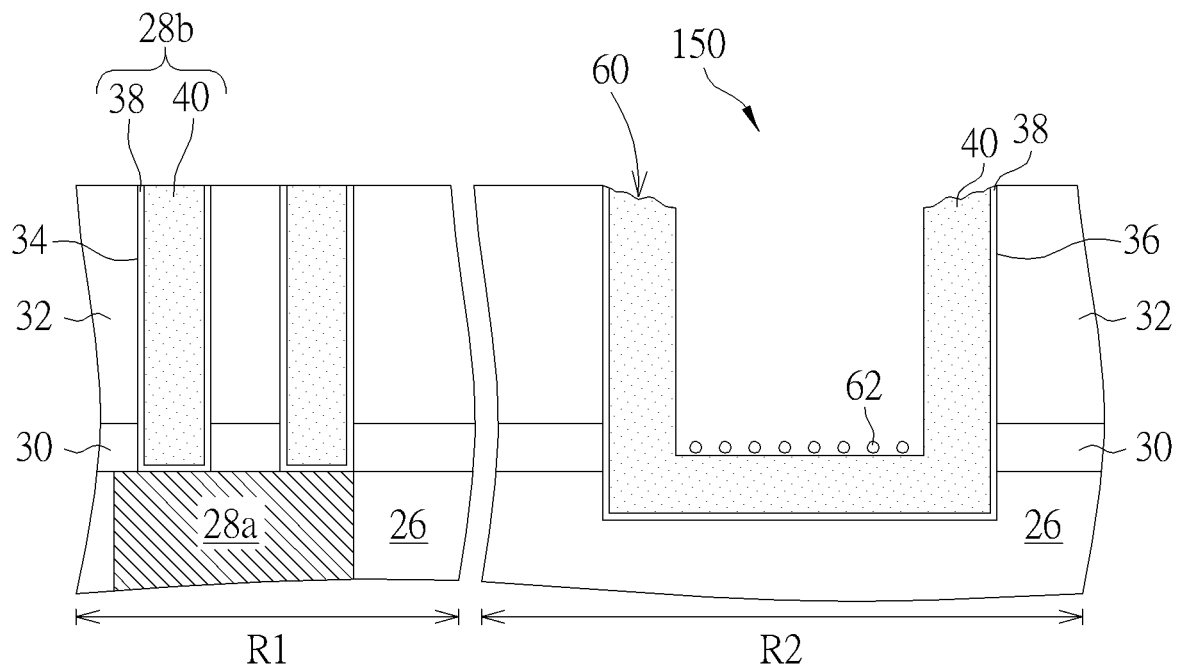
FIG. 9 depicts a fabricating method according to a reference embodiment of the present invention.

FIG. 9 depicts a fabricating method according to a reference embodiment of the present invention, wherein elements which are substantially the same as those in the embodiment of FIG. 4 are denoted by the same reference numerals; an accompanying explanation is therefore omitted.

The difference between the fabricating steps in FIG. 9 and FIG. 4 is that the first material layer 42, the second material layer 44 and the third material layer 46 are not formed in the FIG. 9. As shown in FIG. 9, during the chemical mechanical polishing, the metal layer 40 is not covered by the first material layer 42. Therefore, after the chemical mechanical polishing, the edge of the metal layer 40 and the barrier 38 are damaged, and some recesses 60 are formed at the edge of the metal layer 40 and the barrier 38. Theses recesses 60 may influence the optical contrast of an alignment mark formed afterwards.

After the chemical mechanical polishing, the second dielectric layer 32, the barrier 38, and the metal layer 40 form an alignment mark structure 150 in FIG. 9. However, because the trench 36 is not filled up during the chemical mechanical polishing, some slurry residues 62 of the chemical mechanical polishing may remain on the surface of the metal layer 40 because there is still an opening on the trench 36. These slurry residues 62 will influence the attachment ability of the material layers formed afterwards.

Comparing to the fabricating method of the reference embodiment, the first material layer 42, the second material layer 44 and the third material layer 46 of the second preferred embodiment of the present invention fill up the trench 36, therefore there is no opening during the chemical mechanical polishing. In this way, slurry residues 62 won't remain on the surface of the metal layer 40 and the recess 60 can be avoided after the chemical mechanical polishing.

Figure 10:
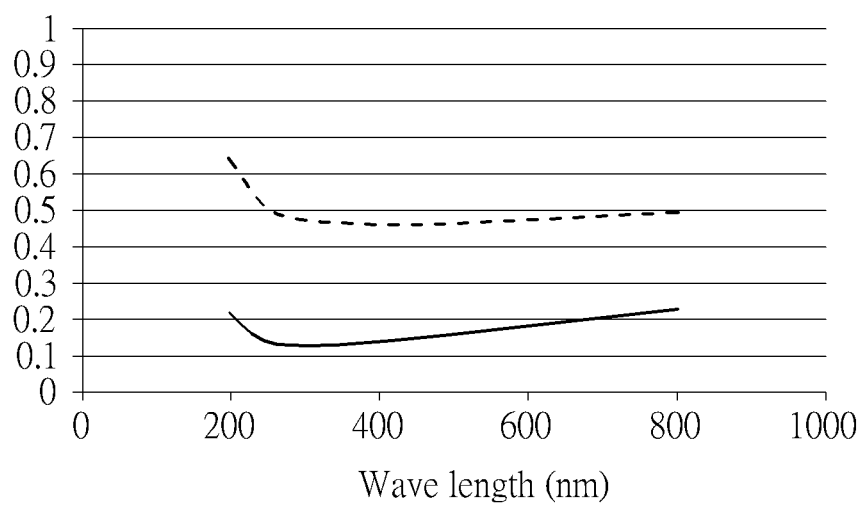
FIG. 10 depicts simulation results of reflectance vs. wavelength of sample 1 and sample 2.

FIG. 10 depicts simulation results of reflectance vs. wavelength of sample 1 and sample 2.

As shown in FIG. 4 and FIG. 10, sample 1 is an alignment mark structure with a structure shown in FIG. 4. In the alignment mark structure of sample 1, the barrier 38 consists of titanium with a thickness of 140 angstroms and titanium nitride with a thickness of 30 angstroms. The thickness of the metal layer 40 is 400 angstroms. The thickness of the first material layer 42 is 100 angstroms. The thickness of the second material layer 44 is 100 angstroms. The thickness of the third material layer 46 is 100 angstroms. The metal layer 40 is tungsten. The first material layer 42 is titanium nitride. The second material layer 44 is silicon nitride. The third material layer 46 is silicon oxide.

As shown in FIG. 9 and FIG. 10, sample 2 is an alignment mark structure with a structure shown in FIG. 9. In the alignment mark structure of sample 2, the barrier 38 consists of titanium with a thickness of 140 angstroms and a titanium nitride with thickness of 30 angstroms. The thickness of the metal layer 40 is 400 angstroms. The metal layer 40 is tungsten.

The reflectance of alignment marks of sample 1 and sample 2 are simulated in several wavelengths such as 200 nm, 400 nm 600 nm and 800 nm and at an incident illumination angle in 90 degrees. As shown in FIG. 10, the reflectance of alignment mark of sample 2 is greater than 0.4. The reflectance of alignment mark of sample 1 is not greater than 0.3. Therefore, comparing to the alignment mark of sample 2, the alignment mark of sample 1 can offer a smaller reflectance, and provides a better contrast for the stepper.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An alignment mark structure, comprising:
    an alignment mark, comprising:
        a dielectric layer;
        a trench embedded in the dielectric layer;
        an alignment mark filling up the trench, wherein the alignment mark comprises:
        a metal layer covering the trench;
        a first material layer covering and contacting the metal layer;
        a second material layer covering and contacting the first material layer; and
        a third material layer covering and contacting the second material layer, wherein the first material layer, the second material layer, and the third material layer independently comprises silicon nitride, silicon oxide, tantalum-containing material, aluminum-containing material, titanium-containing material, or a low-k dielectric having a dielectric constant smaller than 2.7, and a reflectance of the first material layer is larger than a reflectance of the second material layer, the reflectance of the second material layer is larger than a reflectance of the third material layer.

2. The alignment mark structure of claim 1, wherein the metal layer comprises tungsten, copper, or aluminum.

3. The alignment mark structure of claim 1, wherein the first material layer is titanium nitride, the second material layer is silicon nitride, the third material layer is silicon oxide, and the metal layer is tungsten.

4. The alignment mark structure of claim 1, wherein a reflectance of the alignment mark is not greater than 0.3.

5. The alignment mark structure of claim 1, wherein a top surface of the alignment mark is aligned with a top surface of the dielectric layer.

6. The alignment mark structure of claim 1, wherein a thickness of the third material layer is larger than a thickness of the second material layer, the thickness of the third material layer is larger than a thickness the first material layer.

7. A fabricating method of an alignment mark structure, comprising:
    providing a dielectric layer;
    forming a trench embedded in the dielectric layer;
    forming an alignment mark filling up the trench, wherein the alignment mark comprises:
        a metal layer covering the trench;
        a first material layer covering and contacting the metal layer;
        a second material layer covering and contacting the first material layer; and
        a third material layer covering and contacting the second material layer; wherein the first material layer, the second material layer, and the third material layer independently comprises silicon nitride, silicon oxide, tantalum-containing material, aluminum-containing material, titanium-containing material, or a low-k dielectric having a dielectric constant smaller than 2.7, and a reflectance of the first material layer is larger than a reflectance of the second material layer, the reflectance of the second material layer is larger than a reflectance of the third material layer.

8. The fabricating method of the alignment mark structure of claim 7, wherein steps of fabricating the alignment mark comprises:
    forming the metal layer covering the trench and the dielectric layer;
    forming the first material layer covering the metal layer;
    forming the second material layer covering the first material layer;
    forming the third material layer covering the second material layer; and
    planarizing the metal layer, the first material layer, the second material layer, the third material layer to entirely remove the metal layer, the first material layer, the second material layer, the third material layer outside of the trench.

9. The fabricating method of the alignment mark structure of claim 7, wherein the metal layer comprises tungsten, copper, or aluminum.

10. The fabricating method of the alignment mark structure of claim 7, wherein the first material layer is titanium nitride, the second material layer is silicon nitride, the third material layer is silicon oxide, and the metal layer is tungsten.

11. The fabricating method of the alignment mark structure of claim 7, wherein a reflectance of the alignment mark is not greater than 0.3.

12. The fabricating method of the alignment mark structure of claim 7, wherein a thickness of the third material layer is larger than a thickness of the second material layer, the thickness of the third material layer is larger than a thickness of the first material layer.

13. The fabricating method of the alignment mark structure of claim 7, further comprising:
- after forming the alignment mark, forming a bottom material, a memory material and a hard mask material in sequence and covering the dielectric layer;
- forming a patterned photoresist by using the alignment mark to align a lithography mask; and
- patterning the bottom material, the memory material and the hard mask material by taking the patterned photoresist as a mask to form an MRAM.

* * * * *